United States Patent [19]

Takauji

[11] Patent Number: 5,293,311
[45] Date of Patent: Mar. 8, 1994

[54] APPARATUS AND A METHOD FOR CHANGING A RESOLUTION VALUE OF INPUT MUSICAL DATA

[75] Inventor: Kiyomi Takauji, Hamamatsu, Japan

[73] Assignee: Kawai Musical Inst. Mfg. Co., Ltd., Sizuoka, Japan

[21] Appl. No.: 903,082

[22] Filed: Jun. 15, 1992

Related U.S. Application Data

[63] Continuation of Ser. No. 539,353, Jun. 6, 1990, abandoned.

[30] Foreign Application Priority Data

Jun. 7, 1989 [JP] Japan .................. 1-144968

[51] Int. Cl.$^5$ .............................. G06F 15/44
[52] U.S. Cl. ...................... 364/410; 84/659; 84/735
[58] Field of Search .............. 364/410; 84/665, 659, 84/654, 735, 741-747

Primary Examiner—Gail O. Hayes

[57] ABSTRACT

An input data processor selects a value indicated by change border data, and uses this value as a reference value for determining whether a predetermined process is effected, and to change the currently used value indicated by the change border data to another value when the value of the input data becomes equal to a predetermined value. Namely, when the value of the input data is in the vicinity of a specific value, the detection of a change of the input data can be effected by using a resolution smaller than another resolution used for the detection when the value of the input data is not in the vicinity of the specific value. Detection of a change of the input data can be efficiently performed. Further, the apparatus for processing input data may convert the input data into conversion input data so that the rate of a change in the value of the conversion input data in the vicinity of a specific value of the input data is larger or smaller than that of a change in value of the conversion input data corresponding to other input data having values which are not in the vicinity of the specific value. Thus, when the value of the input data is equal to a specific value, the rate of a change of the input data is increased or decreased. Thus, small or large resolution, can be used when the input data becomes equal to the specific value.

34 Claims, 14 Drawing Sheets

| TIME | NEW INPUT DATA | OLD INPUT DATA | UPDATED OLD INPUT DATA | DETECTED CHANGE OF INPUT DATA | CHANGE BORDER DATA | RESOLUTION |
|---|---|---|---|---|---|---|
| $t_1$ | 80 | 0 | 80 | PRESENT | 1 H | SMALL |
| $t_2$ | 82 | 80 | 82 | PRESENT | 2 H | LARGE |
| $t_3$ | 83 | 82 | / | ABSENT | 2 H | LARGE |
| $t_4$ | 85 | 82 | 85 | PRESENT | 2 H | LARGE |
| $t_5$ | 84 | 85 | / | ABSENT | 2 H | LARGE |
| $t_6$ | 81 | 85 | 81 | PRESENT | 2 H | LARGE |
| $t_7$ | 80 | 81 | 80 | PRESENT | 1 H | SMALL |
| ⋮ | ⋮ | ⋮ | ⋮ | ⋮ | ⋮ | ⋮ |

APPARATUS AND A METHOD FOR CHANGING A RESOLUTION VALUE OF INPUT MUSICAL DATA

This application is a continuation, of application Ser. No. 07/539,353 filed on Jun. 6, 1990 now abandoned.

BACKGROUND OF THE INVENTION

1. Field of the Invention

This invention generally relates to an apparatus for processing input data (hereunder referred to as an input data processor), and more particularly, to an input data processor for use in an electronic musical instrument and which performs a predetermined processing of input data when a quantity of a change of input data exceeds a predetermined threshold value indicated by another preliminarily input parameter (hereunder referred to as change border data).

2. Description of the Related Art

A conventional input data processor for use in an electronic music instrument is applied, for example, to a pitch bender in which a sliding contact of a variable resistor is connected to a rotary bending lever or a bending wheel, and a constant voltage is applied across the variable resistor. Namely, when the bending lever or the bending wheel is moved, a contact position to which the sliding contact is connected is changed, and as a result, a fraction of the constant voltage obtained from the sliding contact is also changed. Thereafter, an analog signal indicating the thus-obtained fraction of the constant voltage (i.e., analog input data) is converted into a digital signal, and a pitch of a musical tone sounded by the electronic musical instrument is changed by the input data processor according to a quantity of a change of the digital input data indicated by the digital signal.

Such an input data processor is also applied to a modulation wheel, an expression foot pedal, a balance controller, a Pan Pot controller, a volume controller, a tempo controller, a system for sensing a touch on a key of a keyboard, and a system for detecting an effect depth, etc., in addition to the pitch bender.

Nevertheless, in the conventional input data processor, a resolution of a detection of a change of the input data (i.e., a minimum unit to be used for representing a quantity of a change of the input data to be detected) always has a fixed value; i.e., the resolution is not changed regardless of the value of the input data. Note, however, that in practice, the detection of a change of a value of the input data for some range of values of the input data, should be performed with high precision (i.e., with a small resolution), but for another range of values of the input data, the detection may be effected with a low precision (i.e., with a large resolution). For example, in the case of the pitch bender, by which the pitch of a musical tone to be sounded by the electronic musical instrument is made higher or lower than that preliminarily indicated by an operator or user, the detection of a change of the input data in the vicinity of the preliminarily indicated pitch must be made with a small resolution. Conversely, in ranges of pitches sufficiently distant from the preliminarily indicated pitch, the detection may be effected with a large resolution.

In such a case, if the resolution is not changed regardless of the value of the input data, the small resolution used for the detection in the vicinity of the preliminarily indicated pitch, is naturally employed and thus even in the ranges of pitches sufficiently distant from the preliminarily indicated pitch, the detection is effected with the small resolution. Accordingly, an efficient detection of a change of the input data cannot be achieved with the conventional input data processor.

The present invention is intended to eliminate the foregoing drawback of the prior art, and accordingly, an object of the present invention is to provide an apparatus for processing input data, which apparatus can efficiently detect a change of the input data by changing the resolution of the detection according to the value of the input data.

SUMMARY OF THE INVENTION

To achieve the foregoing object, and in accordance with a first aspect of the present invention, there is provided an input data processor which calculates the quantity of a change of the input data, compares the calculated quantity of the change of the input data with change border data, and then performs a predetermined process. The input data processor is able to generate change border data indicating a plurality of values, and to change the current value of the change border data to another value thereof when the value of the input data becomes equal to a predetermined specific value.

Therefore, in the input data processor according to the first aspect of the present invention, a value of the change border data, which is used as a reference value for determining whether or not the predetermined process has been effected, is changed to another value thereof when the input data has a specific value. Therefore, when the value of the input data is in the vicinity of a specific value, the detection of a change of the input data can be effected by using a resolution smaller than another resolution used for the detection when the value of the input data is not in the vicinity of the specific value, and thus the detection of a change of the input data can be efficiently performed. Note, it is obvious that, when the value of the input data is in the vicinity of a specific value, the detection can be effected by using a resolution larger than another resolution used for the detection when the value of the input data is not in the vicinity of the specific value.

Further, in accordance with a second aspect of the present invention, there is provided an input data processor wherein input data is converted into conversion input data such that the rate of a change in the value of the conversion input data corresponding to that in only the vicinity of a specific value of the input data is larger or smaller than that of a change in value of the conversion input data corresponding to the input data having a value not in the vicinity of the specific value. Further, in the input data processor, old conversion input data is compared with new conversion input data and then, based on the results of the comparison, a predetermined process is carried out corresponding to the change of the conversion input data.

Therefore, when the value of the input data is equal to a specific value, the input data is converted in such a manner that the change of the input data is increased or decreased, and thus a small or large resolution, as used for the detection of a change of the input data, can be used when the input data becomes equal to the specific value. Note, a plurality of values or values within a certain range can be employed as the reference values when determining whether or not the predetermined process is to be effected.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Other features, objects and advantages of the present invention will become apparent from the following description of preferred embodiments, with reference to the drawings which are given by way of illustration only and thus are not limitative of the present invention, and in which like reference characters designate like or corresponding parts throughout several views, and in which.

DESCRIPTION OF THE PREFERRED EMBODIMENTS

Hereinafter, the preferred embodiments of the present invention will be described in detail with reference to the accompanying drawings.

Referring now to FIGS. 1 through 4, a first embodiment will be described in detail.

Figures 3, 4:
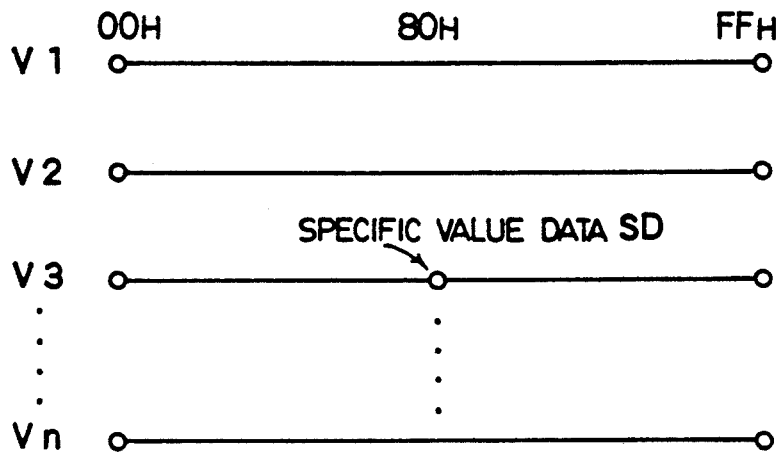
FIG. 3 is a diagram illustrating the relationship between the input data, which is an output of each of the volume control devices provided in the electronic musical instrument, and a resolution to be used for detecting a change of the input data.
FIG. 4 is a diagram showing a change of the resolution to be used for detecting a change of the input data ID.

FIG. 3 illustrates the relationship between an input data ID, which is an output of each of volume control devices $V_1, V_2, \ldots V_n$, and a resolution to be used for detecting a change of the input data ID. As shown in FIG. 3, the input data ID is digital data having value in the range of from $00_H$ to $FF_H$. Note, in this specification, a subscript $H$ refers to hexadecimal and denotes that a numerical value having the subscript $H$ written at the right side there of, is a hexadecimal value. In the first embodiment, where the outputs of the volume control devices $V_1, V_2, \ldots V_n$ are in the vicinities of $00_H$ and $FF_H$ (indicated by white circles in FIG. 3), the resolution is set to be small. In addition, the resolution is also set to be small only where the output of the volume control device $V_3$ is in the vicinity of $80_H$. Further, as can be seen from FIG. 4, the change border data CB, which is used to determine the value of the resolution, becomes small only when the value of the output of the volume control device $V_3$ changes toward $80_H$ (e.g., at the time t7), whereby a change of the input data ID is detected with high precision.

Figure 1:
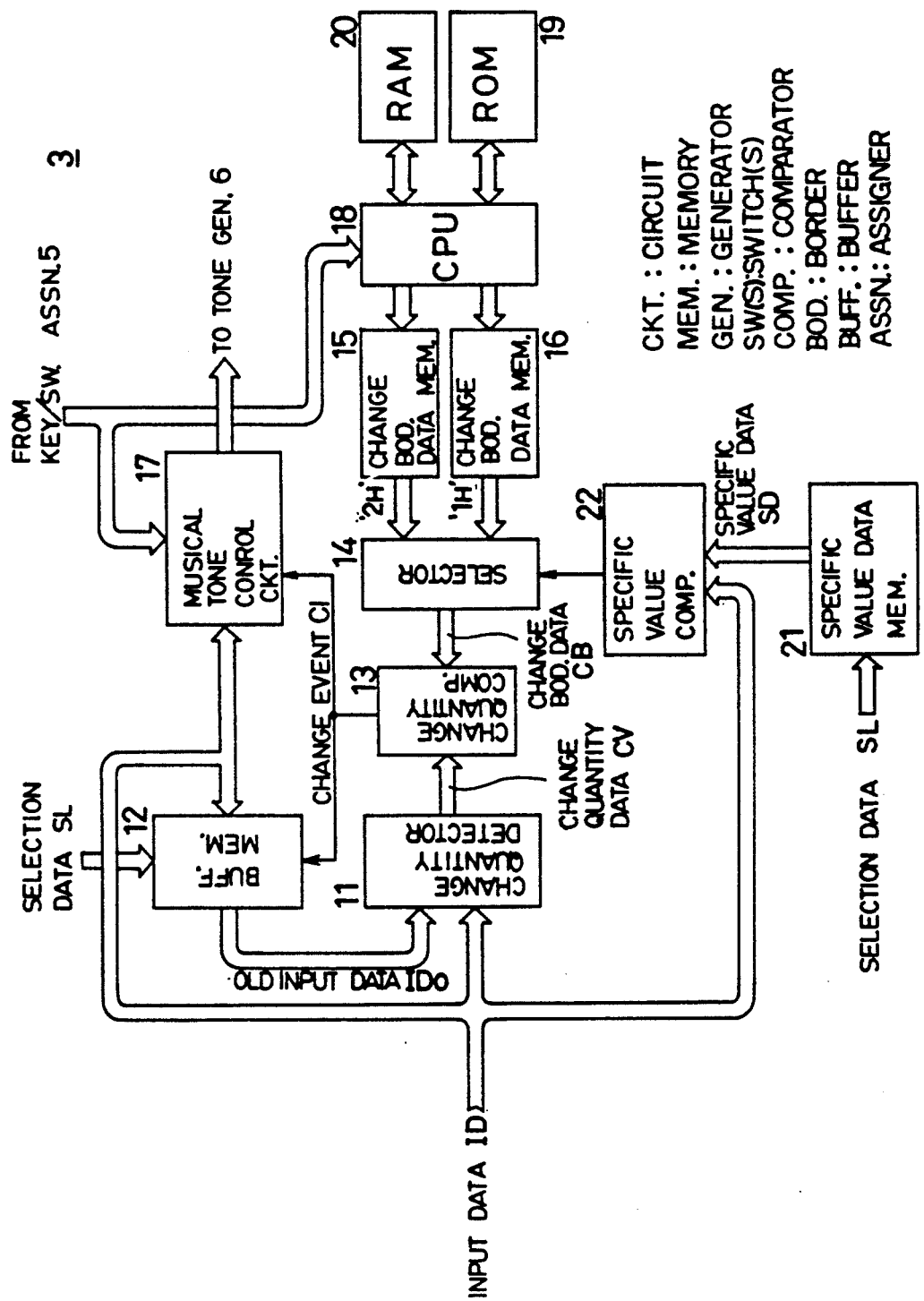
FIG. 1 is a schematic block diagram showing the construction of a circuit for detecting a change of input data.
Figure 2:
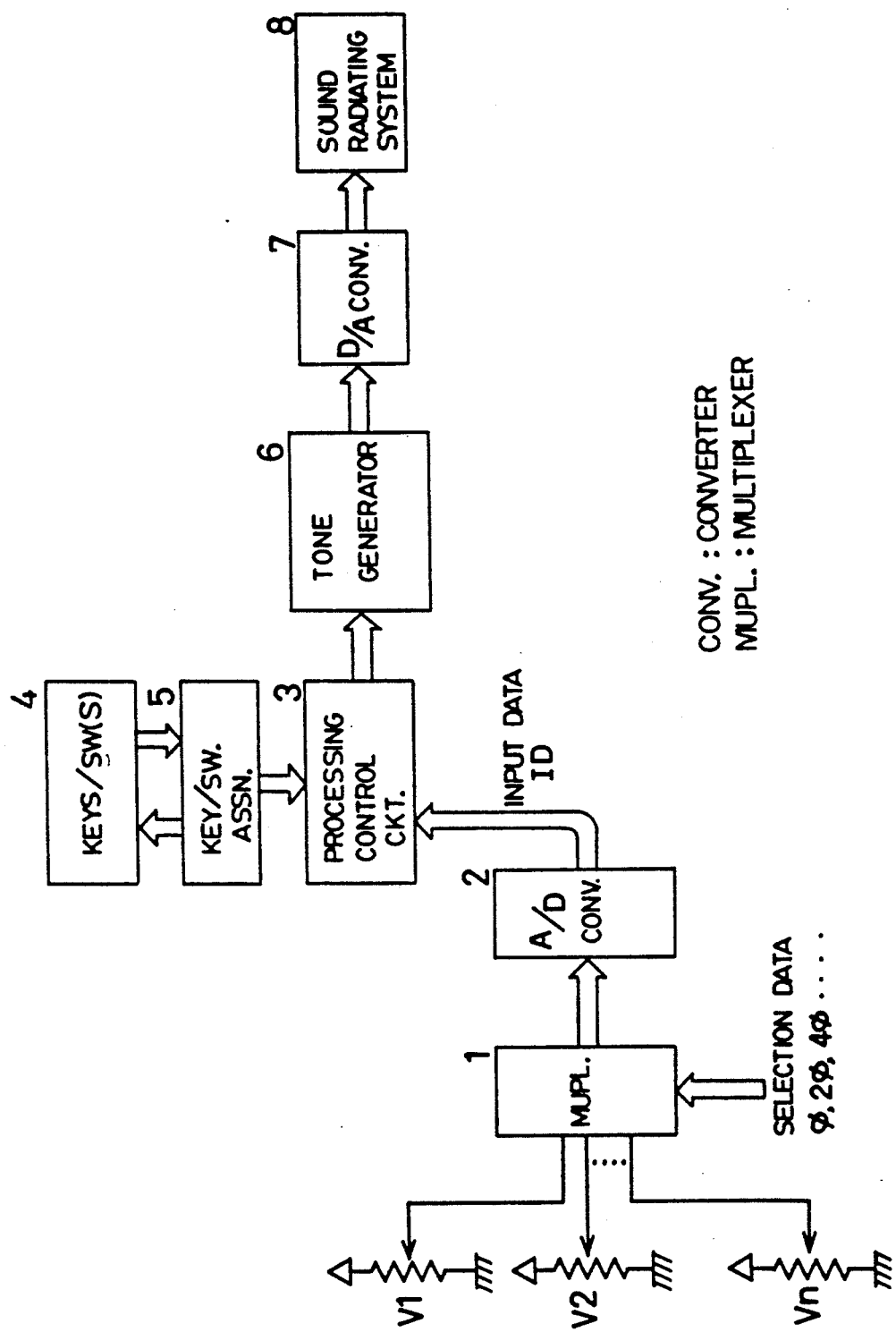
FIG. 2 is a schematic block diagram showing the whole construction of an electronic musical instrument employing the circuit of FIG. 1.

Note, FIG. 1 is a schematic block diagram showing the construction of a circuit for detecting a change of the input data ID (hereunder referred to as a processing control circuit), and FIG. 2 is a schematic block diagram showing the whole construction of an electronic musical instrument employing the process control circuit of FIG. 1.

Each of the volume control devices $V_1, V_2, \ldots V_n$ shown in FIG. 2 is used as, e.g., a pitch bender, a modulation wheel, etc., and may be of any type (e.g., a rotary wheel type, a rotary lever type, a sliding lever type, or a rotary knob type). Further, each of the wheels, levers, etc., of the volume control devices is connected to a contact of a variable resistor, to which a constant voltage is applied. A fraction of the constant voltage obtained from the sliding contact is changed by operating the wheels, levers, etc., of the volume control devices.

The fraction of the constant voltage is represented by analog input data output from each of the volume control devices to an analog-to-digital (A/D) converter 2, through a multiplexer 1. The A/D converter 2 converts the analog input data to digital input data ID, in a time-sharing manner, and then outputs the digital input data ID to a process control circuit 3, whereupon a predetermined process of changing a musical tone, as described in detail later, is performed in accordance with the digital input data ID. On the other hand, information indicating a pitch, timbre, etc., of the musical tone is input by operating keys and/or switches of a keyboard 4, and further, a vacant channel is assigned by a key/switch assigner 5 to the musical tone corresponding to the operated key or switch of the keyboard 4. Moreover, data representing the pitch of the musical tone (hereunder referred to as pitch data) and data representing the timbre of the musical tone (hereunder referred to as timbre data) are output from the key/switch assigner 5 to the process control circuit 3, whereupon the process of changing the pitch data and the timbre data is performed in accordance with the digital input data ID. Thereafter, the thus-changed pitch and timbre data are output from the circuit 3 to a tone generator 6, which then generates a musical tone signal representing a musical tone indicated by the changed pitch and timbre data. Then, the musical tone signal is output from the tone generator 6, through a digital-to-analog (D/A) converter 7, to a musical sound radiating system 8 which radiates the musical tone or sound indicated by the musical tone signal.

Further, selection data SL to be used in the multiplexer 1 is represented by using a number of bits which is equal to an integer obtained by rounding up a portion after the decimal point of the value of the term $\log_2 n$, where n denotes the number of the volume control devices $V_1, V_2, \ldots V_n$. The respective bits of the selection data SL are indicated by a master clock pulse used for synchronizing all of the components of the electronic musical instrument (hereunder referred to as the system) and clock pulses having periods which are 2, 4, 8 . . . times the period of the master clock pulse, respectively.

FIG. 1 illustrates a part of the process control circuit 3.

As shown in FIG. 1, the input data ID is first input from the A/D converter 2 to a device 11 for detecting a quantity of a change of the input data (hereunder referred to as a change quantity detector 11) as new input data IDn. Then, a quantity of a change from old input data IDo, output from a buffer memory 12 to the change quantity detector 11, to the new input data IDn is detected by the detector 11. Further, the change quantity detector 11 outputs change quantity data CV representing the thus-found quantity of change, to a change quantity comparator 13. In this embodiment, the change quantity detector 11 is comprised of a subtracter, a group of exclusive-OR gates, and an adder. The group of exclusive-OR gates is provided in an output stage of the subtracter and is used to invert the sign of the change quantity data CVD when the data CVD is negative. Namely, the most significant bit (MSB) of an output of the subtracter is output to each exclusive-OR gate, whereby the sign of the data is inverted. Further, 1 is added to the inverted data by the adder by inputting the MSB to a Cin-terminal thereof.

The change border data CB is output to the change quantity comparator 13 from a change border data memory 15 or 16, through a 2-input selector 14, and the change border data CB is compared with the change quantity data CV, by the comparator 13. If the data CV is larger than or equal to the data CB, a change event signal CI is output from the comparator 13 to both the buffer memory 12 and a musical tone control circuit 17. The change event signal CI represents a logical sum of data indicatec by a detection signal output from the comparator 13 when the data CV is greater than the data CB and data indicated by a detection signal output therefrom when the data CV is equal to the data CB.

Further, the new input data IDn is input to the buffer memory 12 from the A/D converter 2, the buffer memory 12 stores the new input data IDn when the change event signal CI is also input thereto, and thereafter, the buffer memory 12 outputs the stored data as the old input data IDo. On the other hand, both the pitch data and timbre data from the key/switch assigner 5 and the new input data IDn from the A/D converter 2 are input to the musical tone control circuit 17. When the change event signal CI is also input to the circuit 17, the pitch and tone data are changed in accordance with the new input data IDn. In particular, the changing of the pitch data is performed by, e.g., adding phase angle step data, which corresponds to the pitch data, thereto or subtracting the phase angle step data therefrom. This phase angle step data may be stored in, e.g., a storage area of a memory provided in the circuit 17.

The change border data memories 15 and 16 are composed of registers, and when the power is turned on, two kinds of change border data CB are read from a read-only memory (ROM) 19 and then set in the change border data memories 15 and 16. As described above, the change border data CB is used to determine the value of the resolution to be used for detecting a change of the input data (i.e., a minimum unit to be used for representing a quantity of a change of the input data to be detected). When the data CV indicating the quantity of a change from the old input data IDo to the new input data IDn is greater than or equal to the change border data CB, the system determines that the input data has changed, and performs the predetermined process corresponding to the change of the input data. Note, the change border data CB may be read from the ROM 19 in accordance with at least one of the pitches selected by operating the keys or switches of the keyboard 4, and then written to the memories 15 and 16. In this case, the change border data CB corresponding respectively to the volume control devices $V_1, V_2, \ldots V_n$ is stored in the memories 15 and 16. Furthermore, data equivalent to the selection data SL may be input to the memories 15 and 16 as reading address data.

Further, one kind of the change border data CB has a value of $2_H$ and is set in the memory 15, but the other kind of the change border data CB has a smaller value of $1_H$ and is set in the memory 16. The detection of change of the input data ID is usually effected by using the data CB, having a value equal to $2_H$, but is performed by using the data CB, having a value equal to $1_H$ where the input data ID has a specific value. As described above, the specific value indicated by specific value data SD is equal to $80_H$ in the case of the volume control device $V_3$, which is a pitch bender. A central processing unit (CPU) 18 performs various processes for controlling the musical tone control circuit 17, and further, various data for intermediate processes are stored in a random access memory (RAM) 20.

A specific value data memory 21 is made up of a ROM and stores the specific value data SD corresponding to the input data ID output from each of the volume control devices $V_1, V_2, \ldots V_n$ in storage areas to which a unique address is assigned, respectively. Further, data incremented at a speed which is four times the speed at which the selection data SL used in the multiplexer 1 is incremented, is used as reading address data indicating an address of an storage area of the memory 21 in which data to be read is stored. Moreover, a channel synchronization between an operation of inputting the input data ID from each of the volume control devices $V_1, V_2, \ldots V_n$ to the processing control circuit 3 in the time-sharing manner and an operation of reading the specific value data SD corresponding to each of the devices $V_1, V_2, \ldots V_n$ from the memory 21 is carried out by using the master clock pulse signal and other clock pulse signals having periods which are $\frac{1}{4}, \frac{1}{2}, 2, 4$ and 8 . . . times that of the master clock pulse signal, respectively. In this case, the data SD indicating $00_H$ and that indicating $FF_H$ are respectively read from the memory 21 twice in each period of time (hereunder referred to as a channel time) during which a channel is used for the processing of a detection of a change of the input data ID from one of the volume control devices other than the device $V_3$. Note, in a channel time during which a channel is used for the processing of a detection of a change of the input data ID from the volume control device $V_3$, the data SD indicating $00_H$ and that indicating $FF_H$ are respectively read from the memory 21 once, and the data SD indicating $80_H$ is read therefrom twice.

The specific value data SD thus read from the memory 21 is output to a specific value comparator 22, where the data SD is compared with the input data ID. If the data SD is equal to the input data ID, a coincidence signal is output from the comparator 21 to the selector 14 as a selection switching signal, and thus the change border data CB input to the change quantity comparator 13 is changed from $2_H$, which was output from the change border data memory 15, to $1_H$, which was output from the change border data memory 16, and accordingly the detection of a change of the input data ID is performed with a small resolution.

Note, when the resolution is made smaller, the plurality of specific values indicated by the data SD is not always required, and only one specific value may be used for the detection of a change of the input data SD corresponding to each of the volume control devices $V_1, V_2, \ldots V_n$. In this case, the speed at which the reading address data used for reading the data from the specific data memory 21 is incremented is lowered so that only one specific value data SD is read from the memory 21 in a channel time.

Further, the specific values data SD may be data indicating a fixed range of values of the input data, e.g., from $70_H$ to $90_H$. In this case, the values $70_H$ and $90_H$ are read from the memory 21 in parallel with each other, and then output to two specific value comparators 22 provided in the process control circuit 3. Subsequently, one of the comparators 22 determines whether or not the value indicated by the input data ID is greater than $70_H$, and outputs a detection signal (hereunder referred to as a first detection signal) if that value is greater than $70_H$. The other of the comparators 22 determines whether or not the value indicated by the data ID is less than $90_H$, and outputs another detection signal (hereunder referred to as a second detection signal) if that value is less than $90_H$. Thereafter, a signal representing a logical sum of data indicated by the first and second detection signals is input to the selector 14 as the selection switching signal.

Furthermore, the specific value data memory 21 may be adapted to output all of the specific value data SD corresponding to a different one of the volume control devices $V_1, V_2, \ldots V_n$, in parallel at one time. To this end, a number of the specific value comparators 22 which is equal to the number of volume control devices may be provided in the process control circuit 3, and used to perform the comparison of the value indicated by the input data ID and the specific data SD. In this case, the coincidence signal is output from each of the volume control devices to the selector 14 through an OR gate. In addition, the specific data memory 21 may be made up of a RAM, and in this case, when the power is turned on, the data SD corresponding to each of the volume control devices is read by the CPU 18 from the ROM 19 and then written to the corresponding storage area of the memory 21. Alternatively, in accordance with data representing one of the timbres indicated by operating the keys/switches of the keyboard 4, the data SD corresponding to each of the volume control devices is similarly read by the CPU 18 from the ROM 19 and written to the corresponding storage area of the memory 21.

Moreover, more than two kinds of change border data may be used; i.e., more than two levels of resolutions may be used. In this case, for example, a 4-input selector is employed as the selector 14, instead of the 2-input selector. Further, 4 change border memories, which store the values $1_H$, $2_H$, $3_H$ and $4_H$ indicated by the change border data CB, respectively, are provided in the process control circuit 3.

In this case, 6 specific value comparators 22 are further provided in the process control circuit 3. Two of the comparators 22 are used to determine whether the input data ID is greater than $70_H$ and less than $90_H$, two other of the comparators 22 are used to determine whether the input data ID is greater than $60_H$ and less than $A0_H$, and two other of the comparators 22 are used to determine whether the input data ID is greater than $50_H$ and less than $B0_H$. When data indicated by a detection signal representing a logical sum of the results of the determination effected by the comparators 22 is $111_B$, the change border data CB indicating $1_H$ is selected. Note, a subscript $B$ refers to a binary number and denotes that a numerical value, having the subscript $B$ written at the right side there of, is a binary value. The subscript $B$, however, will be omitted hereinafter. Further, when the data indicated by the detection signal is 011, the change border data CB indicating $2_H$ is selected, when the data indicated by the detection signal is 001, the data CB indicating $3_H$ is selected, and when the data indicated by the detection signal is 000, the data CB indicating $4_H$ is selected. In this case, the data indicated by the detection signal is decoded, and thus 11, 10, 01 and 00 are obtained as the result of the decoding of 111, 011, 001 and 000, respectively.

FIGS. 3 and 4 show a change of the resolution to be used for detecting a change of the input data ID from the volume control device $V_3$. When the input data ID from the device $V_3$ changes to $80_H$, which is the specific value indicated by the data SD, the resolution has a small value $1_H$, and where the input data changes from or does not equal $80_H$, the resolution has a larger value $2_H$. As illustrated in FIG. 3, the input data ID from each of the volume control devices $V_1, V_2, \ldots V_n$ ranges from $00_H$ to $FF_H$. Further, the middle value $80_H$ is the specific value indicated by the data SD corresponding to the volume control device $V_3$.

If the power is turned on at the time t1 shown in FIG. 4, the change border data CB indicating $2_H$ is set by the CPU 18 in the change border memory 15, and the data CB indicating $1_H$ is set in the memory 16. If none of the volume control devices is operated, the new input data IDn from the A/D converter 2 is $80_H$ and the old input data IDo from the buffer memory $12_H$ is $00_H$, and therefore, the change quantity data CV becomes a very large value of $80_H$, and thus the change event signal CI is output from the change quantity comparator 13. Also, the input data indicating $80_H$ is set in the buffer memory 12 and is further input to the musical tone control circuit 17, whereupon the process of changing the musical tone is performed in accordance with the value $80_H$. Note, in practice, the process of changing the musical tone is not performed, because $80_H$ is the input data ID when none of the volume control devices $V_1, V_2, \ldots V_n$ is operated.

Subsequently, the volume control device V3 is operated at the time t2, so that the new input data IDn becomes equal to $82_H$, and at that time, the old input data IDo is equal to $80_H$. Therefore, the change quantity data CV becomes equal to $2_H$, i.e., equal to the current value $2_H$ of the change border data CB from the change border data memory 15. Accordingly, the change event signal CI is output from the change quantity comparator 13, and therefore, the input data IDn indicating $82_H$ is input to the buffer memory 12 and to the musical tone control circuit 17, whereupon the process of changing the musical tone (e.g., the process of adding the phase angle step data to the pitch data) is performed in accordance with the value 82H indicated by the input data IDn.

Thereafter, if the change quantity data CV indicating the difference of the new input data IDo from the old input data IDn is equal to or more than $2_H$ at the times t3, t4, or ..., the process of changing the musical tone (e.g., the process of adding the phase angle step data to the pitch data) is similarly performed in accordance with the value indicated by the input data IDn, and in addition the new input data IDn is input to the buffer memory 12.

As described above, the resolution to be used for the detection of the change of the input data is usually that having the larger value (i.e. $2_H$), and thus the process of changing the musical tone in accordance with the input data is not performed unless the change of the input data ID is equal to or more than $2_H$.

As illustrated in FIG. 4, the value indicated by the old input data IDo and that indicated by the new input data IDn become 81H and 80H at the time t7, respectively, and at that time, a coincidence signal is output from the specific value comparator 22, and further, an output of the selector 14 is switched to the other value (i.e., the smaller value $1_H$) indicated by the change border data CB, which is then input to the change quantity comparator 13. The change quantity data CV output from the change quantity detector 11 to the comparator 13 becomes equal to $1_H$, and thus, the change quantity comparator 13 outputs the change event signal CI. Accordingly, the new input data IDn is set in the buffer memory 12 and input to the musical tone control circuit 17, whereupon the processing of a change of the musical tone is effected in accordance with the value $80_H$.

As described above, when the input data ID becomes equal to $80_H$, the value of the resolution is changed to the smaller value $1_H$. Namely, the detection of change of the input data ID is performed by using the small resolution.

Namely, the detection of change of the input data ID can be performed by using the small resolution only when the input data ID becomes equal to $80_H$, and accordingly, the detection of change of the input data ID can be effected by using a small resolution only in the vicinity of a desired value indicated by the input data ID. Further, in the other range of the value indicated by the input data ID, the detection is performed by using a larger resolution, and thus an efficient detection of the change of the input data can be ensured.

Figure 5:
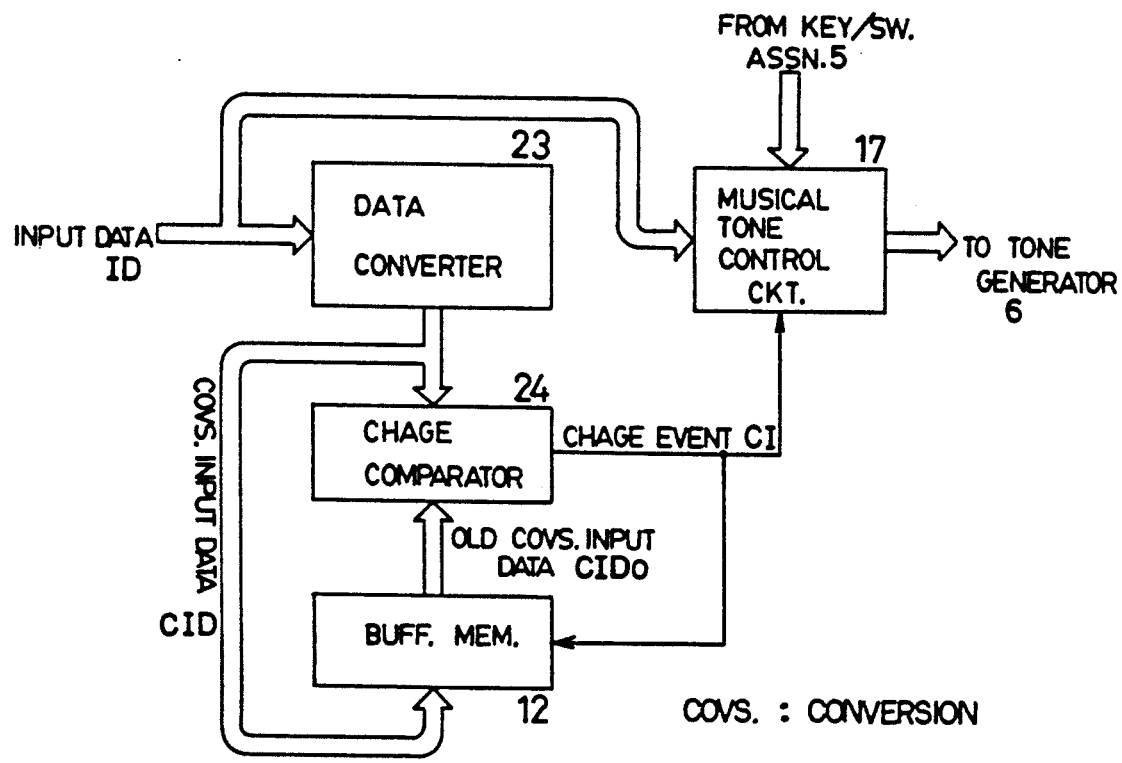
FIG. 5 is a schematic block diagram illustrating the construction of a second embodiment of the present invention.
Figure 6A:
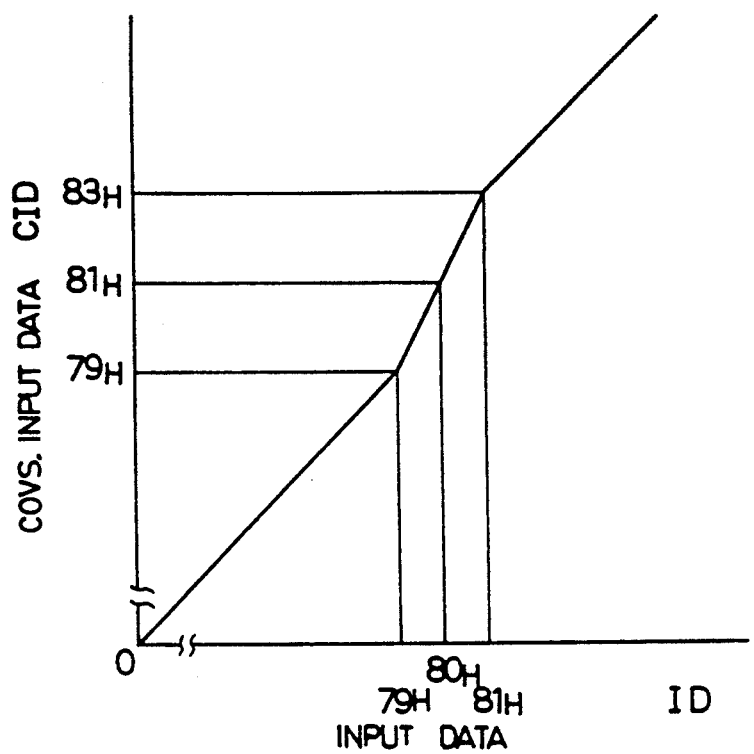
FIGS. 6A and 6B are graphs illustrating a conversion of input data by a data converter of the second embodiment of FIG. 5.

FIG. 5 shows a second embodiment of the present invention. In this embodiment, input data ID output from a volume control device through an A/D converter 2 is input to a data converter 23, whereupon the input data ID is converted into conversion input data CID in accordance with a translation table as shown in FIG. 6A. Namely, the input data having a value of from $00_H$ to $79_H$ is unchanged, but the input data $80_H$ is converted into $81_H$, and further, the values $81_H$, ... and $FF_H$ of the input data are converted to $83_H$, ... and $101_H$, respectively. Accordingly, a rate of the change in the conversion input data, i.e., a gradient of a curve representing the conversion input data, is equal to 1 in the range of values $00_H$-$79_H$ and $81_H$-$FF_H$ of the input data ID, and the gradient becomes equal to 2 in the vicinity of the value $80_H$ of the input data ID.

The conversion input data CID is output from the data converter 23 to a change comparator 24, as new input data IDn, and to a buffer memory 12 which stores the conversion input data. Thereafter, the data CID stored in the buffer memory 12 is output therefrom to the change comparator 24, as old conversion input data CIDo. The comparator 24 outputs the change event signal CI if the new conversion input data CIDn is not equal to the old conversion input data CIDo (i.e., the new conversion input data CIDn has a different value from that of the old conversion data CIDo), and this change event signal CI is input to the buffer memory 12, which fetches the conversion input data CID in response to the signal CI. Further, the signal CI is input to a musical tone control circuit 17, whereupon the pitch data and the timbre data are changed in accordance with the input data ID. In addition, the pitch data and the timbre data may be changed in accordance with the conversion input data CID input from the data converter 23.

Note, in the comparator 24, data represented by bits of the old conversion input data CIDo other than the lowest order bit thereof is compared with data represented by bits of the old conversion input data CIDn other than the lowest order bit thereof, and a signal, is output from the comparator 24 as the change event signal CI representing a logical sum of data represented by a detection signal indicating that the old conversion input data CIDo is greater than the new conversion input data CIDn and data represented by another detection signal indicating that the data CIDo is less than the data CIDn. The reason why the lower order bit of each of the data CIDo and CIDn is excluded from the comparison is that, as in the first embodiment, to change the resolution of detected change of the input data, it is necessary to determine whether or not the change of the input data, i.e., the difference between the new conversion input data CIDn and the old conversion input data CIDo, is equal to or more than $2_H$. Further, as in case of the first embodiment, the input data $79_H$, $80_H$ and $81_H$ are converted by the data converter 23 into the conversion input data $79_H$, $81_H$ and $83_H$, respectively. Therefore, when the value indicated by the input data ID is equal to $80_H$, the change event signal CI is output from the change comparator 24 and the process of changing the musical tone is performed, even though the actual change in the input data (i.e., the difference between the new conversion input data $80_H$ and the old conversion input data $79_H$ or $81_H$) is $1_H$.

Namely, the detection of a change of the input data can be performed by using a small resolution only when the input data ID is $80_H$, and further, when the input data is not $80_H$, the detection is performed by using a larger resolution, and accordingly, an efficient detection of a change of the input data ID can be made. In this case, the detection is performed by using the small resolution not only when the input data ID changes toward $80_H$ but also when the input data ID changes away from $80_H$. Moreover, by employing the data converter 23 using a translation table, as in this embodiment, the construction of a circuit for changing the resolution when detecting a change of the input data ID can be simplified.

Figure 6B:
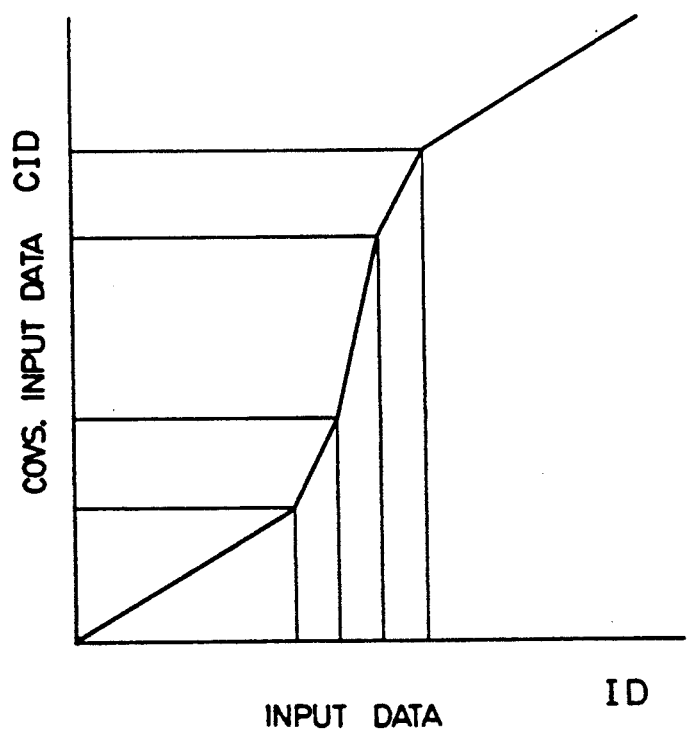

Note, in this embodiment preferable conversion characteristics of the data converter 23, i.e., contents of the translation table, other than as illustrated in FIG. 6A may be employed. Namely, as illustrated in FIG. 6B, the range of values of the input data ID, in which a small resolution is used for the detection of a change of the input data ID, can be expanded, and a plurality of resolutions can be employed for the detection. Note, this embodiment is also similar to the first embodiment in other aspects thereof.

Figure 7:
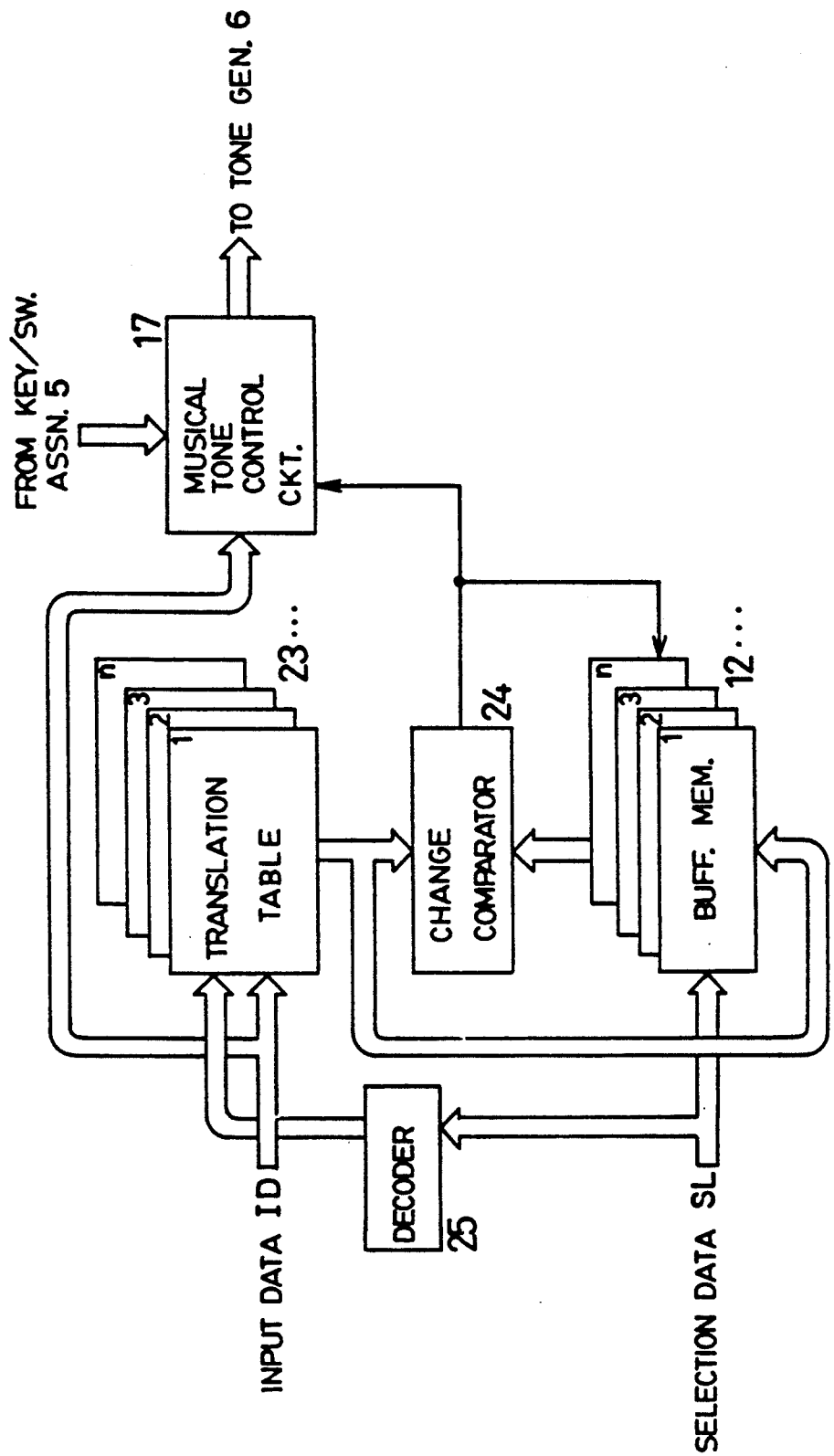
FIG. 7 is a schematic block diagram illustrating the construction of a third embodiment of the present invention.

FIG. 7 shows a third embodiment of the present invention. This embodiment is devised by modifying the second embodiment such that a detection of a change of input data ID output from volume control devices $V_1$, $V_2$, ... $V_n$ can be made. The input data ID, which is output from each of the volume control devices through a multiplexer 1 and an A/D converter 2 in the time sharing manner, is input to and then converted by a number of data converters 23, equal to the number n of the volume control devices $V_1$, $V_2$, ... $V_n$.

Further, data which is the same as the selection data SL input to the multiplexer 1 is decoded by a decoder 25 and then input to each of the converters 23. As described above, the number of the data converters 23 is n, and thus a binary-to-n-ary decoder (i.e., a binary-to-n-adic decoder) is employed as the decoder 25. Further, a decode signal representing the thus-decoded data is input to each of the converters 23 as an enable signal. Moreover, a buffer memory 12 is made up of a RAM having a plurality of addresses, and data which is the same as the selection data SL input to the multiplexer 1 is input to the buffer memory 12 as address data. In addition, a change event signal CI is output from a change comparator 24 to the buffer memory 12 as a write instruction signal.

Therefore, in this embodiment, the resolution for detecting a change of the input data can be changed by performing a channel synchronization of the plurality of the volume control devices $V_1$, $V_2$, ... $V_n$. Further, this embodiment is similar to the second embodiment in other aspects thereof.

Figure 8:
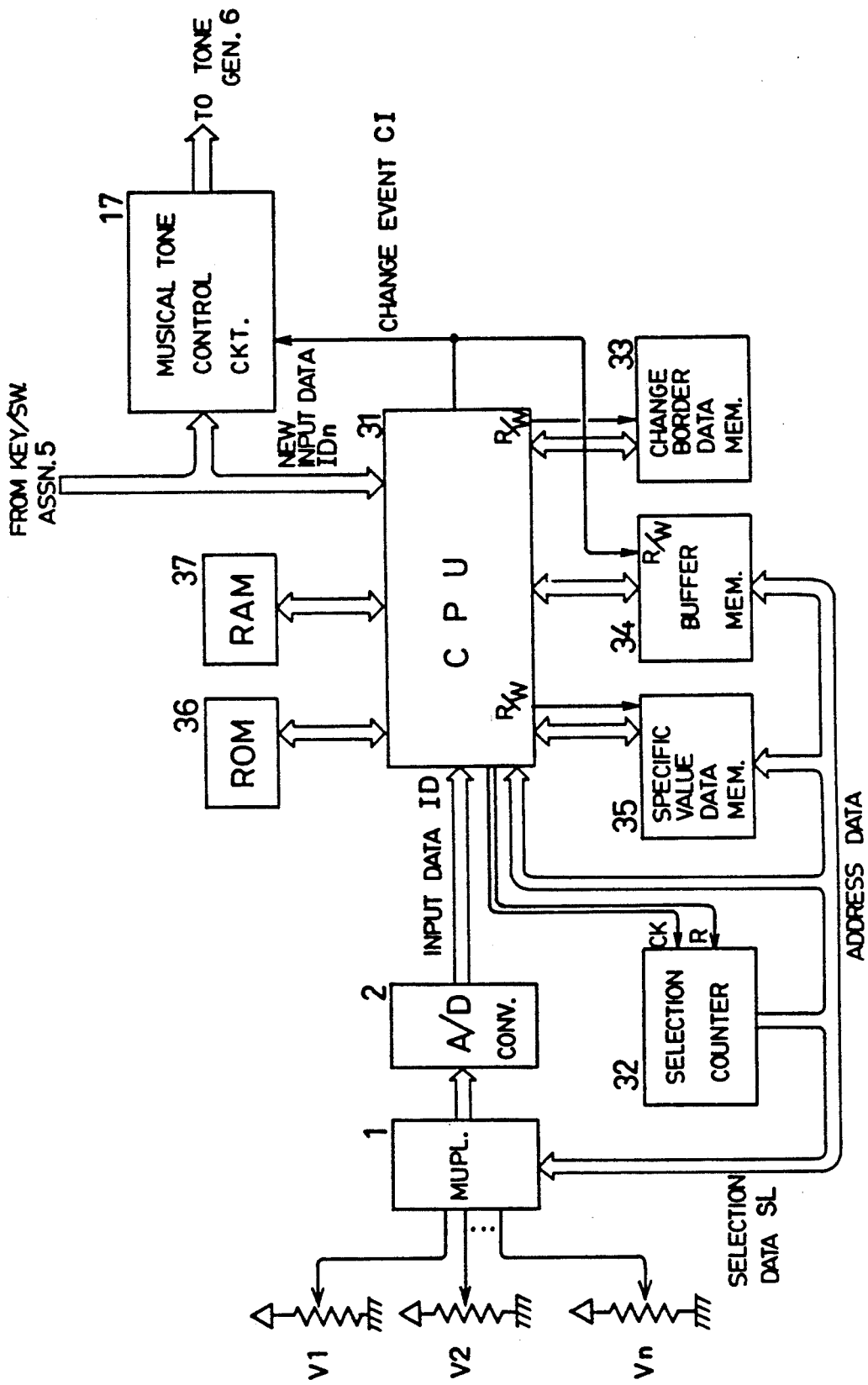
FIG. 8 is a schematic block diagram showing the construction of a fourth embodiment of the present invention.

Next, a fourth embodiment of the present invention will be described with reference to FIGS. 8–10. In this embodiment, the process of changing the resolution used for the detection of a change of the input data ID output from each of volume control devices $V_1$, $V_2$, ... $V_n$ is performed by executing a processing program by a CPU 31.

Note, in this embodiment, the volume control devices $V_1$, $V_2$, ... $V_n$, a multiplexer 1, an A/D converter 2, and a musical tone control circuit 17 are the same as those employed in the first embodiment. The selection data SL is output from a selection counter 32 to the multiplexer 1, to thereby select one of the volume control devices $V_1$, $V_2$, ... $V_n$, and further, the content of the selection counter 32 is incremented by the CPU 31.

Change border data CB is stored in a change border data memory 33. Further, when change quantity data CV indicating the difference between old input data IDo output from a buffer memory 34 and new input data IDn output from the A/D converter 2 is greater than the change border data CB, a change event signal is output from the CPU 31. This change event signal CI, as well as a signal indicating the new input data IDn, is sent to the musical tone control circuit 17, whereupon the process of changing the musical tone is effected in accordance with the new input data IDn. This new input data IDn is written to a buffer memory 34 in response to the change event signal CI, which acts as write instruction signal, and thereafter, the data IDn is output therefrom to the CPU 31 as old input data IDo. The buffer memory 34 is composed of a RAM and stores the old input data IDo corresponding to each of the volume control devices $V_1$, $V_2$, ... $V_n$ at storage areas thereof, to which an address is assigned.

Specific value data SD corresponding to each of the volume control devices $V_1$, $V_2$, ... $V_n$ is stored in a specific value data memory 35. The specific value data SD indicates the value of the input data ID at the time of detecting a change of the input data by using a small resolution, as described above. When the new input data IDn sent from the A/D converter 2 becomes equal to the specific data SD sent from the specific value data memory 35, the value of the change border data CB stored in the change border data memory 33 is changed to a small value, and thus the detection of change of the input data ID is performed by using a small resolution.

The selection data SL is output from the selection counter 32 to the buffer memory 34 and the specific value data memory 35 as address data, thereby performing a channel synchronization for the plurality of volume control devices $V_1$, $V_2$, ... $V_n$. Further, the change border data memory 33 stores the change border data CB which may indicate values corresponding respectively to the volume control devices $V_1$, $V_2$, ... $V_n$. In this case, the change border data memory 33 is made up of a RAM and stores the values indicated by the change border data CB corresponding respectively to the volume control devices $V_1$, $V_2$, ... $V_n$, at storage areas thereof to which an address is assigned. Further, the selection data SL is also output from the selection counter 32 to the change border data CB, as address data.

Various processing programs to be executed by the CPU 31, the specific value data SD to be written to the specific value data memory 35, the change border data to be written to the change border data memory CB, and so on, are stored in a ROM 36. When the power is turned on, the CPU 31 clears the change border data memory 33, the buffer memory 34, and the specific value data memory 35, and increments the content of the selection counter 32. Then, the specific value data SD read from the ROM 36 is sequentially written to the specific value data memory 35, and various intermediary process data, etc., are stored in a RAM 37.

Figure 9:
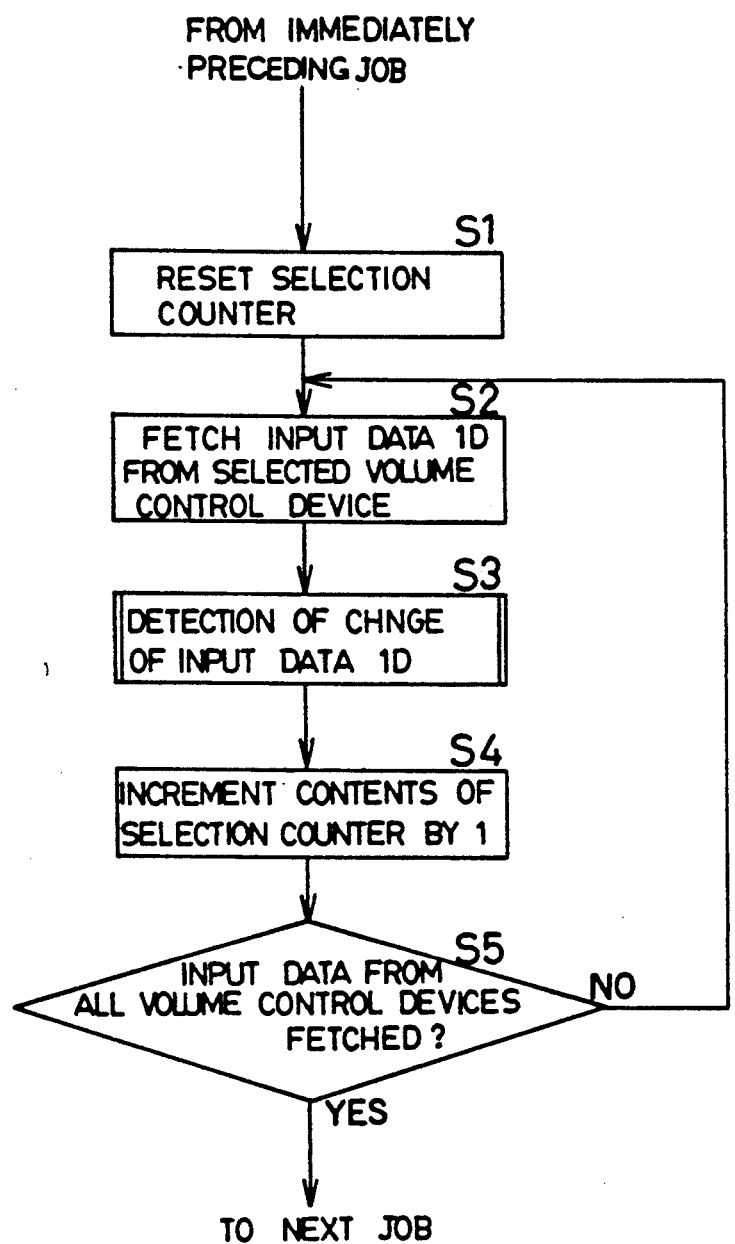
FIG. 9 is a flowchart of a program used for the process of fetching the input data ID performed by the CPU 31.

FIG. 9 shows a flowchart of a program used for the process of fetching the input data ID performed by the CPU 31.

As shown in this flowchart, first the selection counter 32 is reset in step S1, and the program advances to step 2, whereupon the multiplexer 1 fetches the input data ID from the volume control device selected in accordance with the selection data SL output from the selection counter 32. Then, the program goes to step S3, whereupon the process of detecting a change of the thus—fetched input data ID is effected. Next, the program advances to step S4, whereupon the content of the selection counter 32 is incremented by 1, and thereafter, the processes effected in steps 1–4 are also performed on the data input from all of the other volume control devices. If the content of the selection counter 32 exceeds the value indicating the last volume control device (i.e., the processes effected in steps 1–4 are performed on the input data from all of the volume control devices), the program leaves step 5 via the YES branch and advances to the next job step.

Figure 10:
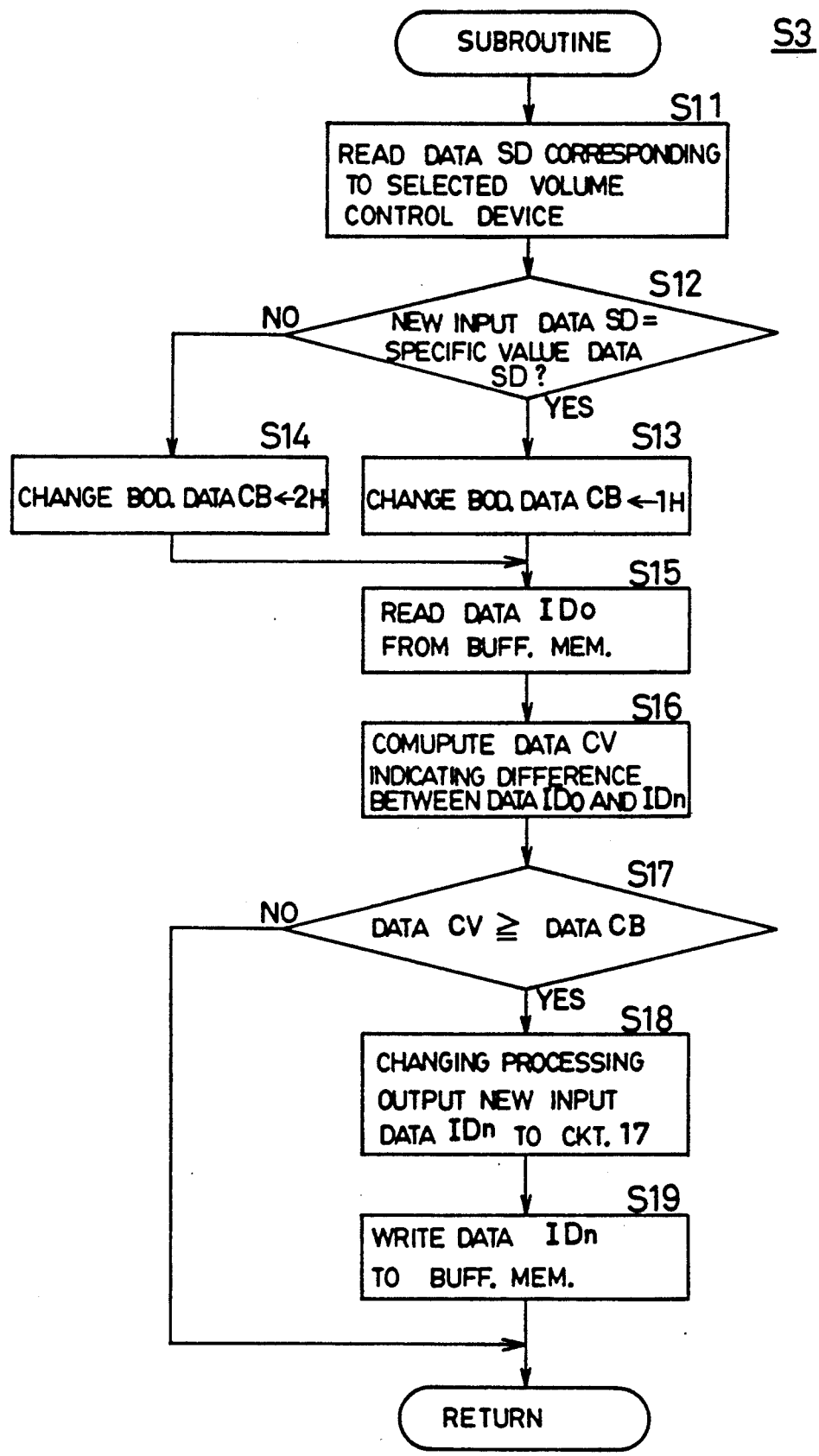
FIG. 10 is a flowchart illustrating in detail the practical routine of the process of detecting a change of the input data, as performed in step 3 of FIG. 9.

FIG. 10 shows a flowchart illustrating in detail the practical content of the process performed in step 3 of FIG. 9.

As illustrated in FIG. 10, in step S11, the old input data IDo is read from a storage area, which has an address indicated by the address data output from the selection counter 32, of the specific value data memory 35, and is then fetched by the CPU 31. Next, the program goes to step S12 and it is determined whether or not the new input data IDn is equal to the specific value data SD. If the new input data IDn is equal to the data SD, the program leaves step S12 via the YES branch and advances to step S13, whereupon the change border data CB indicating the value $1_H$ is set in the change border data memory 33. In contrast, if the new input data IDn is not equal to the data SD, the program leaves step S12 via the NO branch and advances to step S14, whereupon the change border data CB indicating the value $2_H$ is set in the change border data memory 33.

Next, in step S15, the old input data IDo is read by the CPU 31 from a storage area, which has an address indicated by the address data output from the selection counter 32, of the buffer memory 34. Then, the program goes to step S16 and the CPU determines the change in the quantity data CV, which indicates the difference between the old input data IDo and the new input data IDn from the A/D converter 2, by first comparing the new input data IDn with the old input data IDo, and then subtracts the smaller of the data IDo and the data IDn from the other thereof to obtain the absolute value of the difference between the data IDo and the data IDn.

Subsequently, in step S17, it is determined whether or not the change quantity data CV is greater than the change border data CB output from the change border data memory 33. If the data CV is greater than the data CB, the change event signal CI and a signal indicating the new input data IDn are output from the CPU 31 to the musical tone control circuit 17 at step S18, whereupon the process of changing the musical tone is performed in accordance with the new input data IDn. Further, the program then goes to step S19 and the new input data IDn is written to a storage area, which has an address indicated by the address data sent from the selection counter 32, of the buffer memory 34.

As described above, when the input data ID becomes equal to the data SD, the value indicated by the change border data CB is changed from $2_H$ to $1_H$ in steps S11 to S14, and as a result, the detection of a change of the input data ID is effected by using a small resolution corresponding to this smaller value $1_H$ of the change border data ID in steps S15 to S19.

Therefore, the detection of change of the input data can be performed by using a small resolution only when the input data ID is equal to the specific value data SD. Namely, only where the input data ID is in the vicinity of a desired value is the detection of a change thereof effected by using a small resolution. In other cases, the detection is performed by using a larger resolution. Accordingly, an efficient detection of a change of the input data ID can be made. In other respects, this embodiment is similar to the first embodiment.

Figure 11:
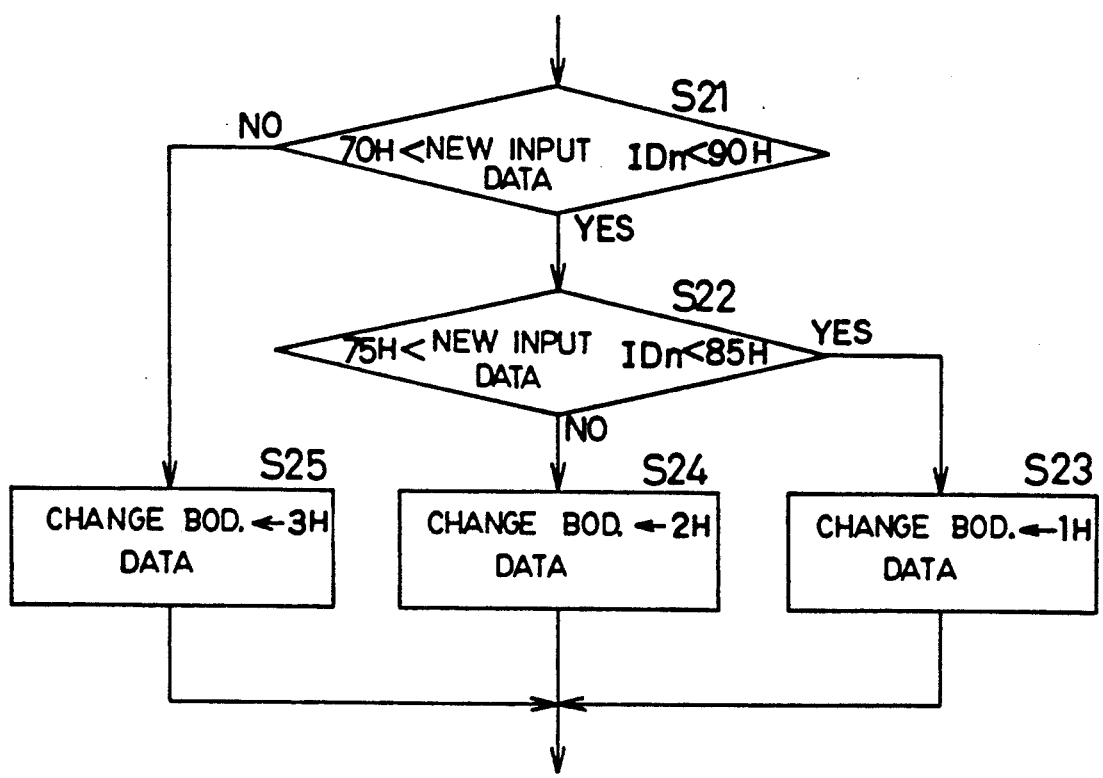
FIG. 11 is a flowchart of an alternative process performed instead of steps S11 to S14 of FIG. 10 when the resolution to be used for the detection of a change of the input data has three levels.

FIG. 11 shows a flowchart of an alternative process performed instead of steps S11 to S14 of FIG. 10 when three values $1_H$, $2_H$ and $3_H$ are used as the change border data CB, and accordingly, the resolution to be used for the detection of a change of the input data has three levels.

As shown in FIG. 11, the value indicated by the change border data CB is $1_H$ if the input data ID is greater than $75_H$ and is less than $85_H$; the value indicated by the data CB is $2_H$ if the data ID is greater than $70_H$ and is less than $90_H$; and the value indicated by the data CB is $3_H$ if the data ID is less than or equal to $70_H$ and is greater than or equal to $90_H$.

Further, as illustrated in FIG. 11, first it is determined in step S21 whether or not the input data ID is greater than $70_H$ and is less than $90_H$. If not, the value $3_H$ is set in the change border data memory 33 as the change border data CB in step S25. In contrast, if the new input data IDn is greater than $70_H$ and is less than $90_H$, it is further determined in step S22 whether or not the new input data IDn is greater than $75_H$ and is less than $85_H$. If not, the value $2_H$ is set in the memory 33 as the data CB in step S24. Further, if the new input data IDn is greater than $75_H$ and is less than $85_H$, the value $1_H$ is set in the memory 33 as the data CB in step S23.

Therefore, where the value indicated by the input data ID is within a predetermined range thereof, a plurality of values of the resolution can be used in the detection of a change of the input data ID. In other respects, this embodiment employing the process of FIG. 11 is similar to the first embodiment.

Figure 12:
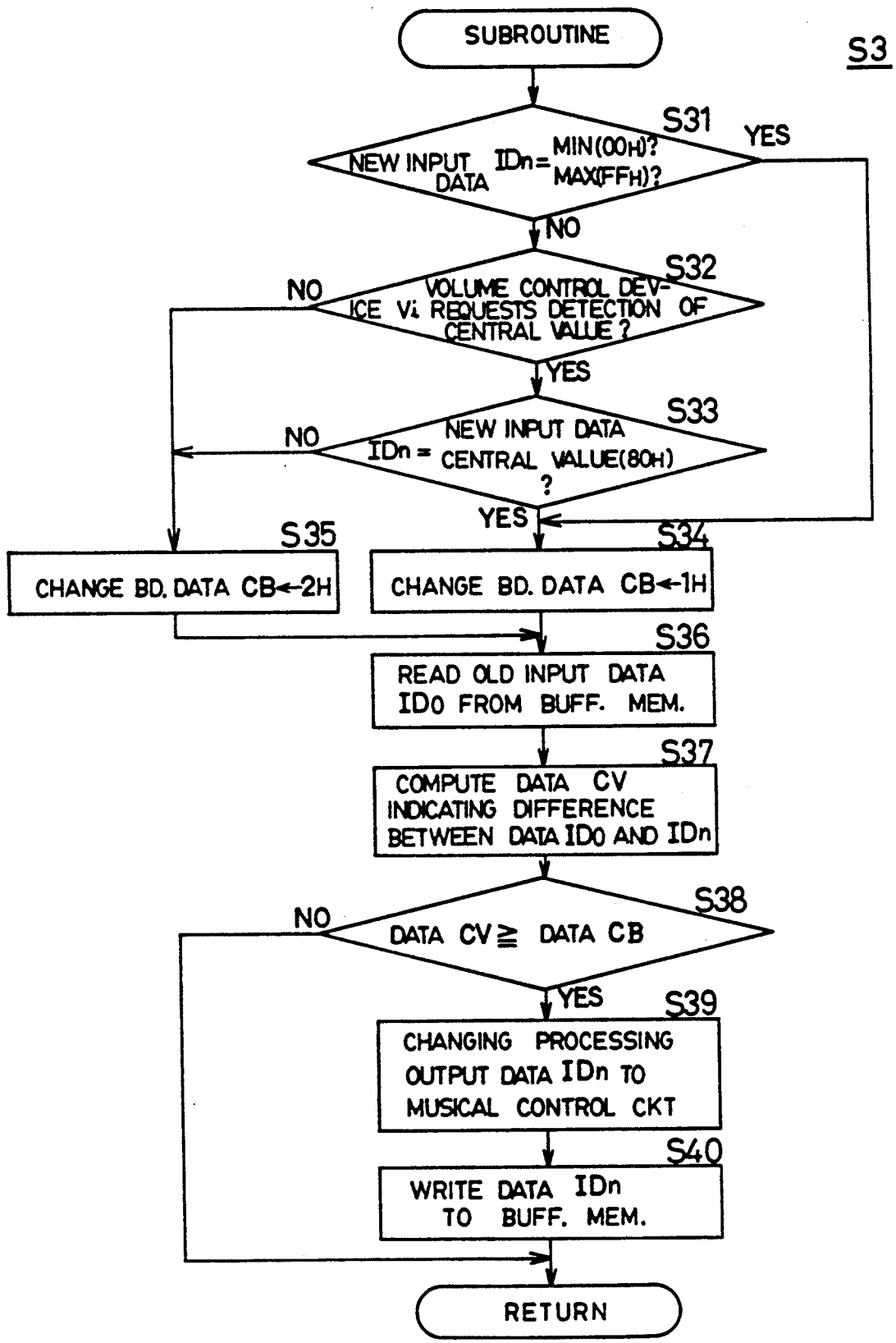
FIG. 12 is a flowchart illustrating an operation of a fifth embodiment of the present invention.

FIG. 12 shows a flowchart illustrating an operation of a fifth embodiment of the present invention, which is obtained by modifying the fourth embodiment thereof. In this embodiment, the specific value data memory 35 is omitted, and further, the resolution to be used for the detection of a change of the input data ID output from a specific volume control device V is changed from $2_H$ to $1_H$ when the input data ID becomes equal to the minimum value $00_H$, the maximum value $FF_H$ and the central value $80_H$.

As shown in FIG. 12, first it is determined in step S31 whether or not new input data IDn is equal to the minimum value $00_H$ or the maximum value $FF_H$. If the data IDn is equal to the minimum value or the maximum value, the value $1_H$ is set in the change border memory 33 as the change border data CB in step S34, and if the data IDn is not equal to the minimum value or the maximum value, the value $2_H$ is set in the memory 33 as the data CB in step S34.

Next, it is determined in step S32 whether or not a volume control device outputting input data in which a change is currently detected is the specific volume control device V outputting the input data in which the change is detected by using a small resolution at the central value 80H. To facilitate this determination, the volume control devices V may be arranged in even-numbered positions as shown in FIG. 8, or arranged together at the end of a row of the volume control devices $V_1, V_2, \ldots V_n$. In such a case, the determination is made in accordance with the lowest order bit of the selection data SL output from the selection counter 32, or is based on whether the value indicated by high order bits of the selection data is more than or equal to a predetermined value.

Subsequently, it is determined in step S33 whether or not the new input data IDn is equal to the central value $80_H$. If the data IDn is equal to the central value, the value $1_H$ is set in the change border data memory 33 as the change border data CB in step S34, and if the data IDn is not equal to the central value, the value $2_H$ is set in the memory 33 as the data CB in step S35. Note, as apparent from a comparison of FIG. 12 and FIG. 10, steps S36–S40 are respectively equivalent to the steps S15–S19 in the forth embodiment.

Accordingly, the resolution to be used for the detection of a change of the input data ID can be changed only for the input data ID from a specific volume control device V, and further, the specific value data memory 35 provided in the fourth embodiment can be omitted. In other respects, this embodiment is similar to the fourth embodiment.

Figure 13:
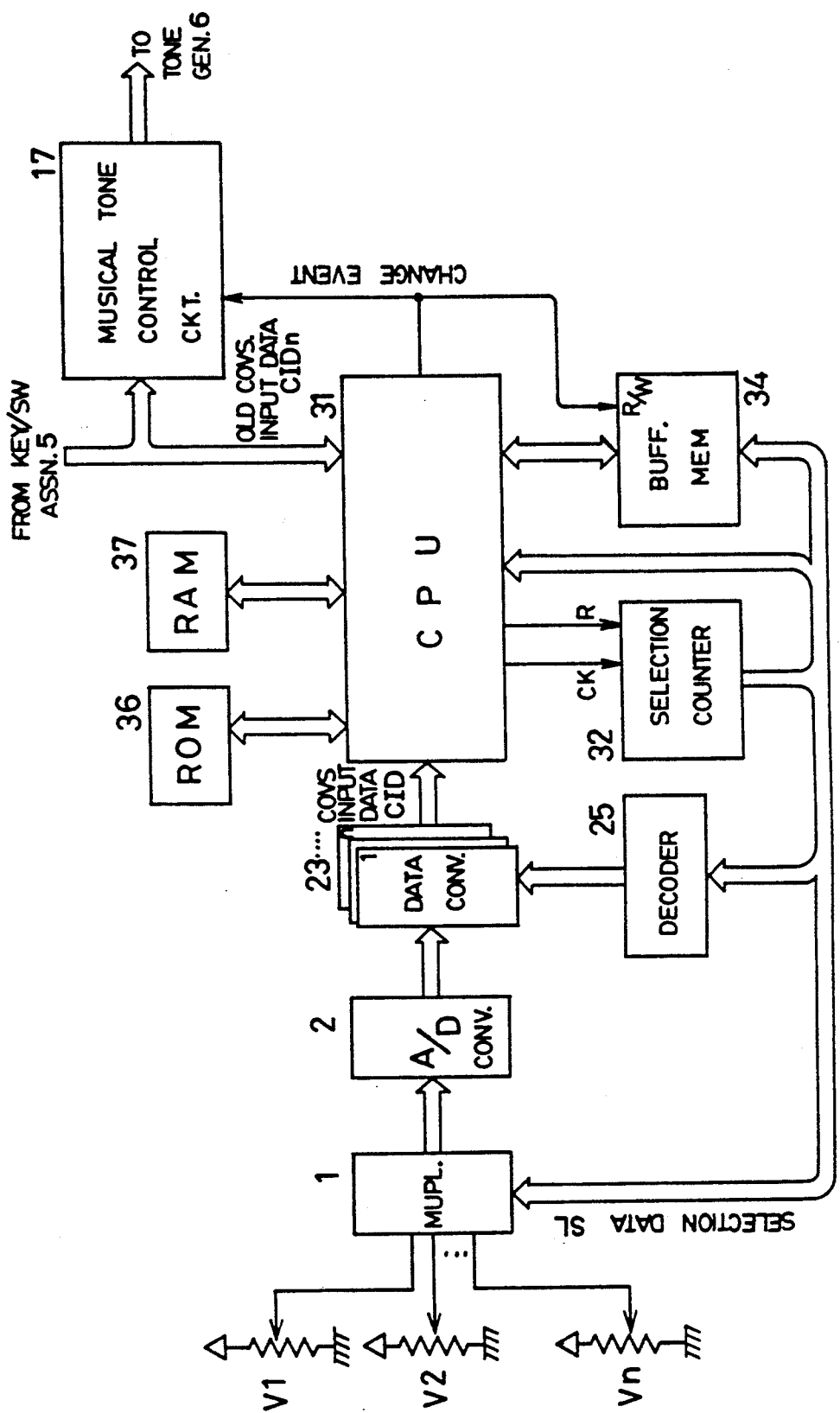
FIG. 13 is a schematic block diagram showing the construction of a sixth embodiment of the present invention.
Figure 14:
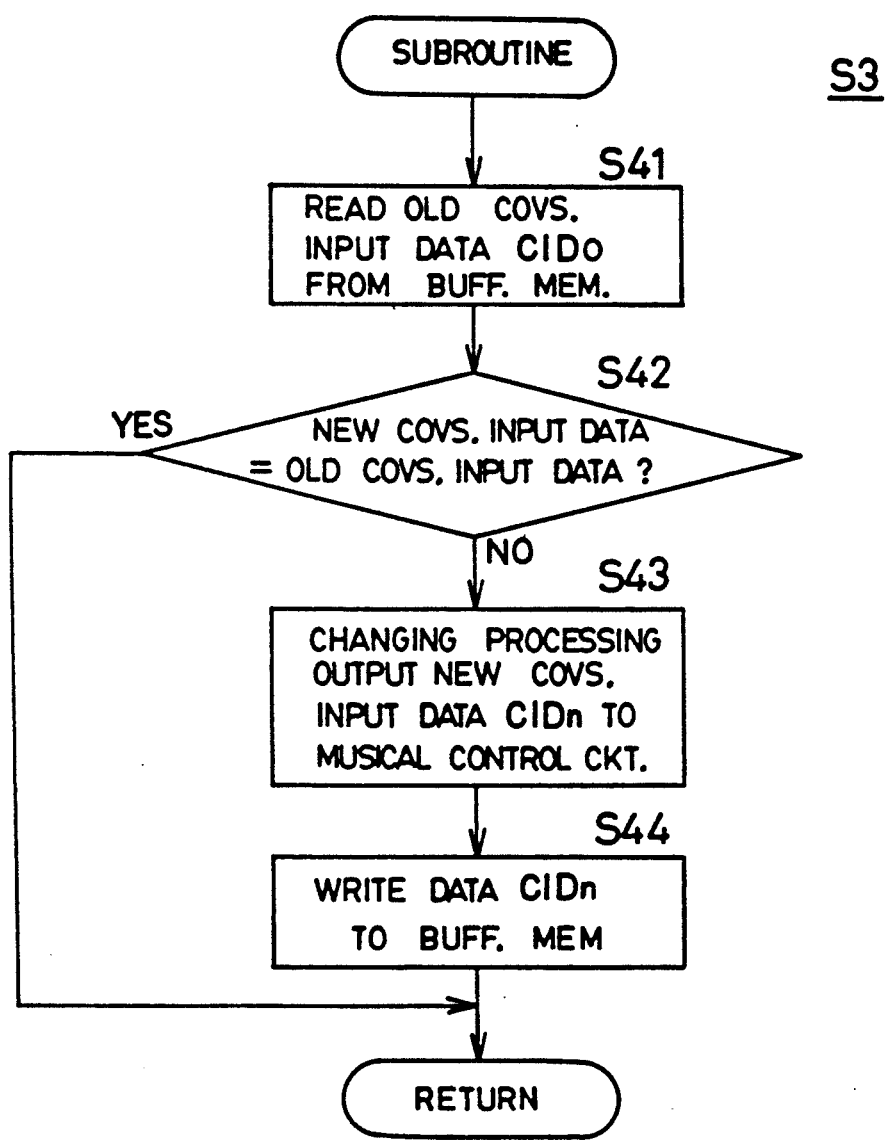
FIG. 14 is a flowchart of a program used to detect a change of conversion input data CID, in the sixth embodiment of FIG. 13.
Figure 15:
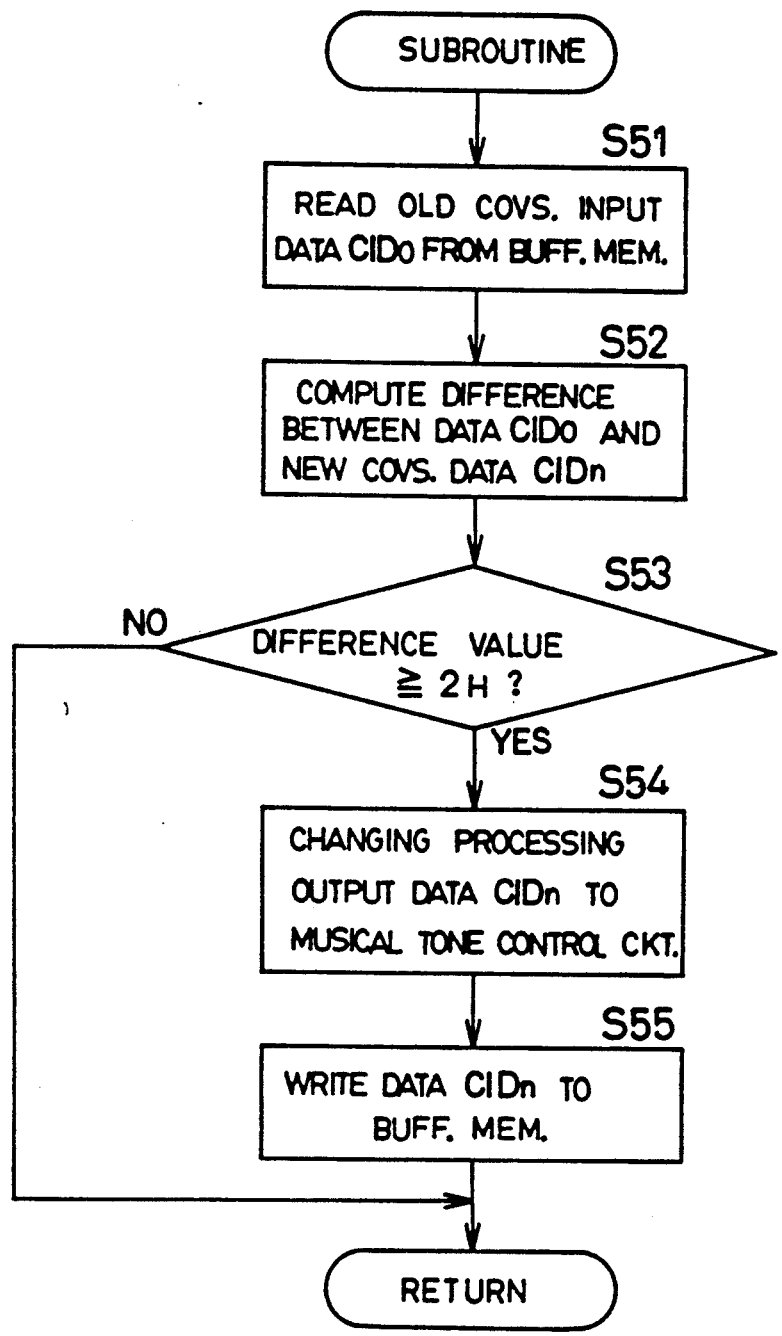
FIG. 15 is a flowchart of another program obtained by modifying the program illustrated in FIG. 14.

FIGS. 13 to 15 show a sixth embodiment of the present invention. This embodiment is obtained by adding a data converter 23 and a decoder 25 as provided in the third embodiment of FIG. 7 to, and removing the change border data memory 33 and the specific value data memory 35 from, the circuit of the fourth embodiment of FIG. 8. In the data converter 23, the input data ID input thereto is converted into conversion input data CID as illustrated in FIG. 6. Further, the conversion input data CID is written by a CPU 31 to a buffer memory 34 and is later output therefrom to the CPU as old conversion input data CIDo. Furthermore, selection data SL output from a selection counter 32 is decoded by the decoder 25, and the decoded data then input to the data converter 23. Note, it is assumed that the number of data converters 23 is n. Namely, a binary-to-n-ary decoder is employed as the decoder 25, which outputs a decode signal to each of the converters 23 as an enable signal.

Further, in the CPU 31, the processes illustrated in FIGS. 9, 14 and 15 are performed. FIGS. 14 and 15 are flowcharts illustrating the content of the process effected in step S3 of FIG. 9, in detail. Note, in this case, "input data ID" should be read as "conversion input data CID" in step S3 of FIG. 9.

As shown in FIG. 14, first the old conversion input data CIDo is read from the buffer memory 34 in accordance with the address data output from the selection counter 32 in step S41, and then new input data IDn output from the data converter 23 is compared with this conversion old input data IDo in step S42. If the data CIDn is not equal to the data CIDo (i.e., the data CIDn is different from the data CIDo), a signal representing the data CIDn, as well as a change event signal CI, is output from the CPU 31 to a musical tone control circuit 17, which changes the pitch data and the timbre data in accordance with the data CID, in step S43. The pitch data and the timbre data may be changed in accordance with input data ID output from an A/D converter 2. The program then goes to step S44 and the signal representing the data CIDn, as well as the change event signal CI, is input to the buffer memory 34, which then stores the data CIDn as old conversion input data CIDo.

In this case, the comparison between the data CIDo and the data CIDn made in the step S42 is practically effected by using data represented by bits of the data CIDo other than the lowest order bit and data represented by bits of the data CIDn other than the lowest order bit. The reason why the lowest order bit of each of the data CIDo and CIDn is practically excluded from the comparison is that, as in the first embodiment, when changing the resolution for detecting a change of the conversion input data, it is necessary to determine whether or not the change of the conversion input data, i.e., the difference between the new conversion input data CIDn and the old conversion input data CIDo, is equal to or more than $2_H$. Further, as in case of the first embodiment, the input data $79_H$, $80_H$, and $81_H$ are converted by the data converter 23 into the conversion input data $79_H$, $81_H$, and $83_H$, respectively, and therefore, when the value indicated by the input data ID is equal to $80_H$, the process of changing the musical tone is performed even though the actual change in the input data ID (i.e., the difference between the new conversion input data $80_H$ and the old conversion input data $79_H$ or $81_H$) is $1_H$.

Therefore, the detection of a change of the input data ID can be performed by using a small resolution only when the input data ID is $80_H$. Further, when the input data is not $80_H$, the detection is performed by using a larger resolution, and thus an efficient detection of a change of the input data ID can be made. In this case, the detection is performed by using the small resolution not only when the input data ID changes toward $80_H$ but also when the input data ID changes away from $80_H$.

Therefore, the construction of a circuit for changing the resolution for detecting a change of the input data ID can be simplified by employing the data converter 23 using a translation table, as in this embodiment. In other respects, this embodiment is similar to the fourth embodiment.

FIG. 15 shows a flowchart of another program obtained by modifying the program illustrated in FIG. 14. In the process of FIG. 15, first the old input data IDo is read by the CPU 31 from a storage area, which has an address indicated by the address data output from the selection counter 32, of the buffer memory 34 in step S51. Then, the program goes to step S52 and the CPU determines the difference between the old conversion input data CIDo and the new conversion input data CIDn by subtracting the smaller one of the data IDo and the data IDn from the other, to thereby obtain the absolute value of the difference between the data IDo and the data IDn.

Then, in step S53, it is determined whether or not the difference between the old conversion input data CIDo and the new conversion input data CIDn is greater than the value $2_H$ indicated by the change border data CB. If this difference is greater than the data CB, the process as effected in steps S43 and S44, in accordance with the data CID, is performed in steps S54 and S55.

Therefore, in the embodiment employing the process of FIG. 15, it becomes relatively easy to change the change border data CB. In other respects, this embodiment is similar to the fourth embodiment.

Although preferred embodiments of the present invention have been described above, it is understood that the present invention is not limited thereto and that other modifications will be apparent to those skilled in the art without departing from the spirit of the invention. For example, the data ID input to the specific value comparator 22 of FIG. 1 may be replaced by the old input data IDo output from the buffer memory 12, and therefore, even when the input data ID is changed from the $80_H$ indicated by the specific value data SD, the value of the resolution to be used for the detection of a change of the input data ID can be changed to a small value $1_H$. Further, when the input data ID becomes equal to the specific value data SD, the resolution may be increased. Furthermore, digital data directly input from a counter, which is worked by operating an up-key or a down-key, other than the digital data converted from the analog input data may be used as the input data ID, and data input from external equipment or data obtained by further processing the data ID may be used as the input data for which a change is to be detected.

The scope of the present invention, therefore, is determined solely by the appended claims.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. An apparatus for changing a resolution value of input musical data in an electronic musical instrument, comprising:
   old input musical data storing means for storing old input musical data previously input thereto;
   change quantity calculating means for calculating a quantity of a change of input musical data, newly input thereto and old input musical data received from said old input musical data storing means;
   change border data generating means for generating a plurality of change border data each having a different value and representing the resolution value of the input musical data;
   first determining means for determining if the quantity of a change of input data calculated by said change quantity calculating means is not less than a value of one of the change border data received from said change order data generating means;
   input musical data processing means for effecting predetermined musical process according to the change of input musical data, on the basis of the determination of said first determining means;
   second determining means for determining whether the value indicated by input musical data is equal to at least one predetermined value; and
   change border data changing means for changing the value of the change border data to that of another one of the change border data generated by said change border data generating means, on the basis of the determination of said second determining means, and changing the resolution value of the input musical data to the predetermined value.

2. The apparatus for changing the resolution of input musical data as set forth in claim 1, wherein said change border data generating means generates more than two change border data each having a different value for each input musical data.

3. The apparatus for changing the resolution value of input musical data as set forth in claim 1, wherein said second determining means determines whether the value indicated by the new input musical data is equal to the predetermined value.

4. The apparatus for changing the resolution value of input musical data as set forth in claim 1, wherein said determining means determines whether the value indicated by the old input musical dat is equal to the predetermined value.

5. The apparatus for changing the resolution value of input musical data as set forth in claim 1, wherein said determining means determines whether the value indicated by the new input musical data is in a predetermined range of values.

6. The apparatus for changing the resolution value of input musical data as set forth in claim 1, wherein said determining means determines whether the value indicated by the old input musical data is in a predetermined range of values.

7. The apparatus for changing the resolution value of input musical data as set forth in claim 1, wherein said change border data changing means changes the value of the change border data to that of another smaller value of the change border data generated by said change border data generating means, and changes the resolution value of the input musical data to a large resolution value.

8. The apparatus for changing the resolution value of input musical data as set forth in claim 1, wherein said change border data changing means changes the value of the change border data to that of another one of the change border data generated by said change border data generating means, only when the input musical data is a part of a plurality of groups of input musical data.

9. The apparatus for changing the resolution value of input musical data as set forth in claim 1, wherein said old input musical data storing means, said change quantity calculating means, said first determining means, said input musical data processing means, said second determining means, and said change border data changing means process a plurality of groups of input musical data and change border data.

10. An apparatus for changing the resolution value of input musical data in an electronic musical instrument, comprising:
    converting means for converting input musical data into conversion input musical data, wherein a rate of a change of the conversion input musical data when the input musical data is at least one predetermined value is different from that of the rate of change of the conversion input musical data when the input musical data is not the predetermined value, and changing a resolution value of the input musical data to the predetermined value;
    old input musical data storing means for storing old conversion input musical data previously output thereto from said converting means;
    comparing means for comparing the old conversion input musical data output from said old input musical data storing means with new conversion input musical data newly output from said converting means; and
    input musical data processing means for effecting a predetermined musical process according to the change of the input musical data input to said converting means or the new conversion input musical data output from said converting means, on the basis of the comparison by said comparing means.

11. The apparatus for changing the resolution value of input musical data as set forth in claim 10, wherein said converting means employs more than two values as the value of the rate of a change of conversion input musical data.

12. The apparatus for changing the resolution value of input musical data as set forth in claim 10, wherein the predetermined value in said converting means is plural ranges of the predetermined value.

13. The apparatus for changing the resolution value of input musical data as set forth in claim 10, wherein said converting means converts input musical data into conversion input musical data, wherein a rate of a change of the conversion input musical data when the input musical data is at least one predetermined value is different from that of a change of the conversion input musical data when the input musical data is not the predetermined value, only when the input musical data is a part of a plurality of groups of input musical data.

14. The apparatus for changing the resolution value of input musical data as set forth in claim 10, wherein said converting means converts input musical data into conversion input musical data, wherein a rate of a change of the conversion input musical data when the input musical data is at least one predetermined value is larger than that of a change of the conversion input musical data when the input musical data is not the predetermined value, and changes the resolution value of the input musical data to a large resolution value.

15. The apparatus for changing the resolution value of input musical data as set forth in claim 10, wherein said converting means converts input musical data into conversion input musical data, wherein a rate of a change of the conversion input musical data when the input musical data is at least one predetermined value is smaller than that of a change of the conversion input musical data when the input musical data is not the predetermined value, and changes the resolution value of the input musical data to a small resolution value.

16. The apparatus for changing the resolution value of input musical data as set forth in claim 10, wherein said input musical data processing means effects the predetermined musical process according to the change of the input musical data or the new conversion input musical data, when the comparison effected by said comparing means indicate that the difference between the old conversion input musical data output from said old conversion input musical data storing means and the new conversion input musical data newly output from said converging means is equal to or more than a preset value.

17. The apparatus for changing the resolution value of input musical data as set forth in claim 10, wherein said converting means, said old input musical data storing means, said comparing means, and said input musical data processing means process a plurality of groups of input musical data.

18. A method for changing a resolution value of input musical data in an electronic musical instrument, comprising the steps of:
  (a) storing old input musical data previously input thereto;
  (b) calculating a quantity of a change of input musical data, newly input thereto and old input musical data stored in said step (a);
  (c) generating a plurality of change border data each having a different value and representing the resolution value of the input musical data;
  (d) determining the quantity of a change of the input data calculated in said step (b) is not less than a value of one of the change border data generated in said step (c);
  (e) effecting predetermined musical processing according to the change of input musical data, on the basis of the determination effected in said step of (d);
  (f) determining whether the value indicated by input musical data is equal to at least one predetermined value; and
  (g) changing the value of the change border data to that of another one of the change border data generated in said step (c), on the basis of the determination effected in said step (f), and changing the resolution value of the input musical data at the predetermined value.

19. The method for changing the resolution value of input musical data as set forth in claim 18, wherein said step (c) generates more than two change border data, each having a different value for each input musical data.

20. The method for changing the resolution value of input musical data as set forth in claim 18, wherein said step (f) determines whether the value indicated by the new input musical data is equal to the predetermined value.

21. The method for changing the resolution value of input musical data as set forth in claim 18, wherein said step (f) determines whether the value indicated by the old input musical data is equal to the predetermined value.

22. The method for changing the resolution value of input musical data as set forth in claim 18, wherein said step (f) determines whether the value indicated by the new output musical data is equal to the predetermined value.

23. The method for changing the resolution value of input musical data as set forth in claim 18, wherein said step (f) determines whether the value indicated by the old input musical data is in a predetermined range of values.

24. The method for changing the resolution value of input musical data as set forth in claim 18, wherein said step (e) changes the value of the change border data to that of another smaller value of the change border data generated in said step (c), and changes the resolution value of the input musical data to a large resolution value.

25. The method for changing the resolution value of input musical data as set forth in claim 18, wherein said step (e) changes the value of the change border data to that of another one of the change border data generated in said step (c), only when the input musical data is a part of a plurality of groups of input musical data.

26. The method for changing the resolution value of input musical data as set forth in claim 18, wherein said steps (a), (b), (d), (e), (f) and (g) a plurality of groups of input musical data and change border data are processed.

27. A method for changing the resolution value of input musical data in an electronic musical instrument, comprising the steps of:
  (a) converting input musical data into conversion input musical data, wherein a rate of a change of the conversion input musical data when the input musical data is at least one predetermined value is different from that of a change of the conversion input musical data when the input musical data is not the predetermined value, and changing the resolution value of the input musical data at the predetermined value;
  (b) storing old conversion input musical data previously converted thereto in said step (a);
  (b) comparing the old conversion input musical data stored in said step of (b) with new conversion input musical data newly converted in said step (a); and
  (d) effecting a predetermined musical process according to the change of the input musical data input in said step (a) or the new conversion input musical data converted in said step (a), on the basis of the comparison effected in said step (c).

28. The method for changing the resolution value of input musical data as set forth in claim 27, wherein said step (a) more than two values are employed as the value of the rate of change of conversion input musical data.

29. The method for changing the resolution value of input musical data as set forth in claim 27, wherein the predetermined value in said step (a) is plural ranges of the predetermined value.

30. The method for changing the resolution value of input musical data as set forth in claim 27, wherein said step (a) converts input musical data into conversion input musical data, wherein a rate of a change of the conversion input musical data when the input musical data is at least one predetermined value is different from that of a change of the conversion input musical data when the input musical data is not the predetermined value, only when the input musical data is a part of a plurality of groups of input musical data.

31. The method for changing the resolution value of input musical data as set forth in claim 27, wherein said step (a) converts input musical data into conversions input musical data, a rate of a change of the conversion input musical data when the input musical data is at least one predetermined value is larger than that of a change of the conversion input musical data when the input musical data is not the predetermined value, and changes the resolution value of the input musical data to a large resolution value.

32. The method for changing the resolution value of input musical data as set forth in claim 27, wherein said step (a) converts input musical data into conversion input musical data, wherein a rate of a change of the conversion input musical data when the input musical data is at least one predetermined value is smaller than that of a change of the conversion input musical data when the input musical data is not the predetermined value, and change the resolution value of the input musical data to a small resolution value.

33. The method for changing the resolution value of input musical data as set forth in claim 27, wherein said step (d) effects the predetermined musical process according to the change of the input musical data or the new conversion input musical data, when the comparison effected in said step (c) indicates that the difference between the old conversion input musical data stored in said step (b) and the new conversion input musical data newly converted in said step (a) are equal to or greater than a present value.

34. The method for changing the resolution value of input musical data as set forth in claim 27, wherein said steps (a), (b), (c) and (d) a plurality of groups of input musical data are processed.

* * * * *